(12) United States Patent
Mathur et al.

(10) Patent No.: US 12,412,623 B2
(45) Date of Patent: Sep. 9, 2025

(54) PRECHARGE CIRCUITRY FOR USE WITH BITLINES

(71) Applicant: Arm Limited, Cambridge (GB)

(72) Inventors: Rahul Mathur, Austin, TX (US); Hsin-Yu Chen, Austin, TX (US); Phani Raja Bhushan Chalasani, Austin, TX (US); Kyung Woo Kim, Austin, TX (US); Edward Martin McCombs, Jr., Austin, TX (US)

(73) Assignee: Arm Limited, Cambridge (GB)

( * ) Notice: Subject to any disclaimer, the term of this patent is extended or adjusted under 35 U.S.C. 154(b) by 155 days.

(21) Appl. No.: 17/835,912

(22) Filed: Jun. 8, 2022

(65) Prior Publication Data

US 2023/0402092 A1 Dec. 14, 2023

(51) Int. Cl.
*G11C 7/22* (2006.01)
*G11C 11/412* (2006.01)
*G11C 11/419* (2006.01)

(52) U.S. Cl.
CPC .......... *G11C 11/419* (2013.01); *G11C 11/412* (2013.01)

(58) Field of Classification Search
CPC ... G11C 11/419; G11C 11/412; G11C 11/413; G11C 7/12
See application file for complete search history.

(56) References Cited

U.S. PATENT DOCUMENTS

| | | | |
|---|---|---|---|
| 10,008,260 B1 | 6/2018 | Maiti et al. | |
| 10,497,414 B1 | 12/2019 | Mathur et al. | |
| 11,017,142 B1 * | 5/2021 | Chen | G06F 30/373 |
| 11,100,965 B1 * | 8/2021 | Sisodia | G11C 8/08 |
| 11,271,567 B1 | 3/2022 | Chen et al. | |
| 2003/0198110 A1 * | 10/2003 | Hasegawa | G11C 7/1051 365/200 |
| 2006/0164904 A1 * | 7/2006 | Saleh | G11C 16/24 365/226 |
| 2010/0329062 A1 * | 12/2010 | Campbell | G11C 7/12 365/189.11 |
| 2011/0158021 A1 * | 6/2011 | Wiatrowski | G11C 7/12 365/203 |
| 2013/0083613 A1 * | 4/2013 | Phan | G11C 11/413 365/226 |
| 2013/0094307 A1 * | 4/2013 | Cheng | G11C 11/419 365/191 |

(Continued)

OTHER PUBLICATIONS

Chang, et al.; 12.1 A 7nm 256Mb SRAM in High-K Metal-Gate FinFET Technology with Write-Assist Circuitry for Low-VMIN Applications; 2017 IEEE International Solid-State Circuits Conference (ISSCC); pp. 206-207; Feb. 2017. DOI: 10.1109/ISSCC.2017.7870333.

(Continued)

*Primary Examiner* — Mushfique Siddique
(74) *Attorney, Agent, or Firm* — Pramudji Law Group PLLC; Ari Pramudji (57) ABSTRACT

Various implementations described herein are directed to a device having memory circuitry with bitlines coupled to an array of bitcells. The device may include precharge circuitry that precharges the bitlines during modes of operation including a standby mode of operation and an active mode of operation. In some instances, the precharge circuitry may include a low power mode of operation that prevents precharge of the bitlines during the standby mode of operation.

20 Claims, 6 Drawing Sheets

(56) References Cited

U.S. PATENT DOCUMENTS

| | | | |
|---|---|---|---|
| 2015/0009772 A1* | 1/2015 | Chen | G11C 5/148 |
| | | | 365/227 |
| 2018/0268895 A1* | 9/2018 | Jain | G11C 11/419 |
| 2019/0066772 A1 | 2/2019 | Singh et al. | |
| 2019/0325948 A1* | 10/2019 | Nautiyal | G11C 11/419 |
| 2020/0194047 A1 | 6/2020 | Chen et al. | |

OTHER PUBLICATIONS

Calimera, et al.; Design Techniques and Architectures for Low-Leakage SRAMs'; IEEE Transactions on Circuits and Systems I: Regular Papers; vol. 59, No. 9; pp. 1992-2007; Feb. 2012.

Kim, et al.; Circuit and Microarchitectural Techniques for Reducing Cache Leakage Power; IEEE Transactions on Very Large Scale Integration (VLSI) Systems; vol. 12, No. 2; pp. 167-184; Feb. 2004. DOI: 10.1109/TVLSI.2003.821550.

* cited by examiner

PRECHARGE CIRCUITRY FOR USE WITH BITLINES

BACKGROUND

This section is intended to provide information relevant to understanding the various technologies described herein. As the section's title implies, this is a discussion of related art that should in no way imply that it is prior art. Generally, related art may or may not be considered prior art. It should therefore be understood that any statement in this section should be read in this light, and not as any admission of prior art.

In high performance Systems-on-Chip (SoC), leakage power consumption has become comparable to the dynamic component, and this leakage relevance increases as technology scales higher. There is considerable static power consumption from the bitline precharge header supply through the bitlines into the bitcell ground. Also, lengthy routed bitlines are typically highly capacitive and thus consume significant dynamic power when long bitlines are precharged. Therefore, in some modern bitcell architecture, conventional memory cell devices use traditional layout techniques and thus suffer from bitline leakage that typically results in unintended consequences related to excessive static and dynamic power consumption. Accordingly, traditional layout techniques of some bitcell architecture can be power inefficient, and as such, there exists a need to improve the traditional layout techniques of memory cells that allow for efficient use of power.

BRIEF DESCRIPTION OF THE DRAWINGS

Implementations of various techniques are described herein with reference to the accompanying drawings. It should be understood, however, that the accompanying drawings illustrate only various implementations described herein and are not meant to limit embodiments of various techniques described herein.

DETAILED DESCRIPTION

Various implementations described herein refer to bitline precharging schemes and techniques for memory applications in various physical layout designs. For instance, the various schemes and techniques described herein may provide for a novel low power bitline precharge scheme for use in system cache memories for lower static and dynamic power consumption. Some implementations described herein provide a scheme for bitline precharge operation that precharges bitlines at the start of an active read or write cycle in which read and write operations are being performed, e.g., after the external clock signal is asserted (e.g., when CLK=1). Some implementations described herein may provide a scheme for a bitline precharge operation that may only precharge the accessed bank in a multi-bank memory configuration. Some implementations described herein may provide a scheme for a bitline precharge operation that may only precharge either a flexible bitline (FBL, NFBL) or a non-flexible bitline (BL, NBL). Further, some implementations described herein may provide a scheme for a bitline precharge operation that may selectively tune or adjust the width of the bitline precharge signal with an externally tunable separate EMA (Extra Margin Adjust) signal. Thus, the various schemes and techniques described herein may provide for lowering static and dynamic power consumption in memory.

Various implementations of providing fabrication schemes and techniques for memory applications will be described herein with reference to FIGS. 1-5.

Figure 1:
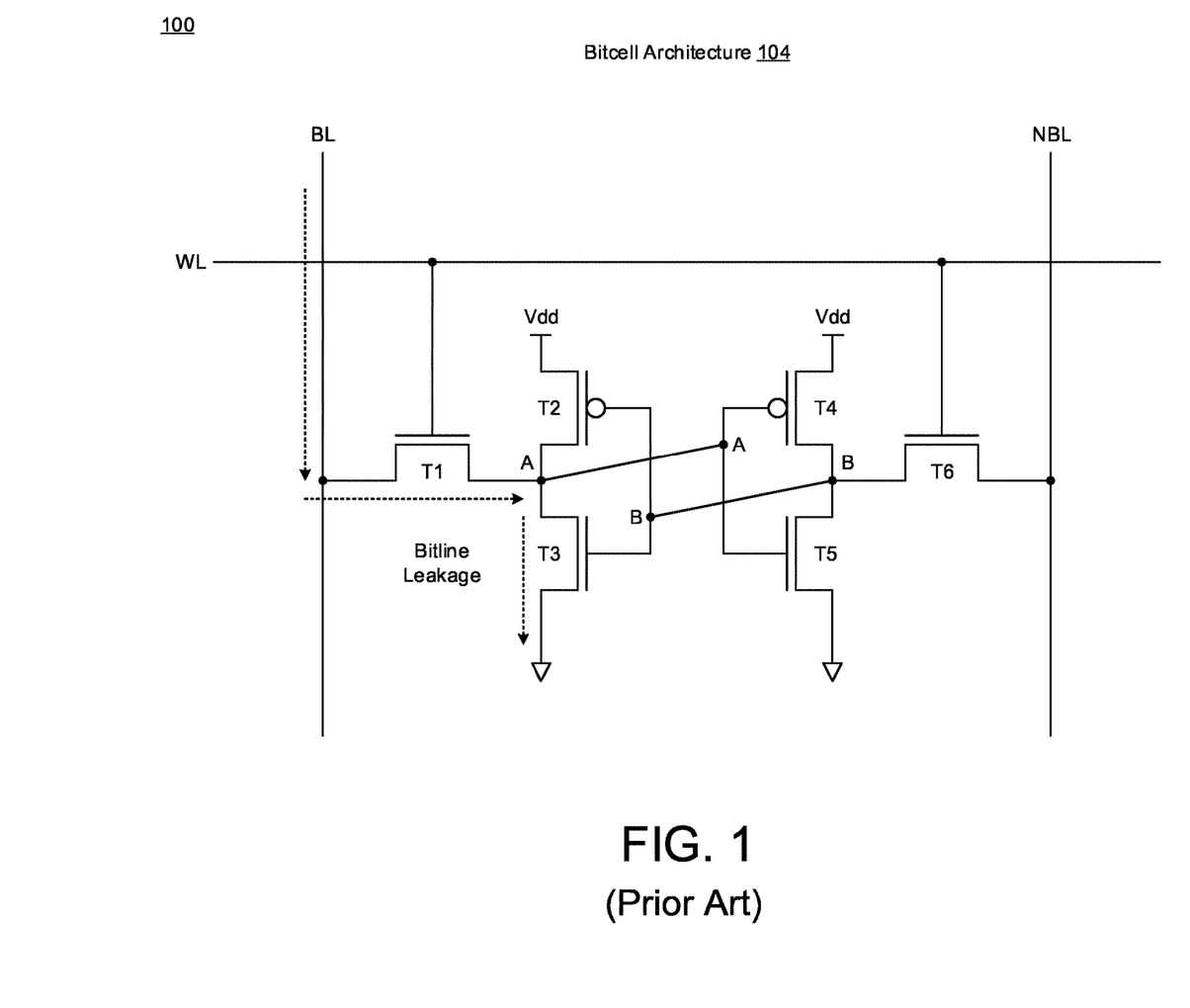
FIG. 1 illustrates a diagram of bitcell architecture in accordance with various implementations described herein.

FIG. 1 illustrates a diagram 100 of bitcell architecture 104 in accordance with various implementations described herein.

In some implementations, the bitcell architecture 104 may be implemented as a system or a device having various integrated circuit (IC) components that are arranged and coupled together as an assemblage or combination of parts that provide for physical circuit designs and various related structures. In some instances, a method of designing, providing and building the bitcell architecture 104 as an integrated system or device may involve use of various IC circuit components described herein so as to thereby implement fabrication schemes and techniques associated therewith. Further, the bitcell architecture 104 may be integrated with computing circuitry and related components on a single chip, and the bitcell architecture 104 may be implemented in various embedded systems for automotive, electronic, mobile, server and Internet-of-things (IoT) applications.

As shown in FIG. 1, the bitcell architecture 104 may include a multi-transistor bitcell structure, such as, e.g., a six-transistor (6T) static random access memory (SRAM) bitcell structure. In some instances, the six-transistors (6T) may include multiple (e.g., 4) N-type metal-oxide-semiconductor (NMOS) transistors along with multiple (e.g., 2) P-type MOS (PMOS) transistors. Passgate transistor (T1) may be coupled between a first bitline (BL) and node (A), and passgate transistor (T6) may be coupled between a second bitline (NBL) and node (B) that is complementary to the first bitline (BL). The wordline (WL) may be coupled to the gates of transistors (T1, T6) to access data stored in a latch formed with transistors (T2, T3, T4, T5) via the wordline (WL) and bitlines (BL, NBL). Also, transistors (T2, T3) may be coupled in series between the voltage supply (Vdd) and ground (Gnd or Vss), wherein node (A) is formed between pull-up transistor (T2) and pull-down transistor (T3). Transistors (T4, T5) may be coupled in series between voltage supply (Vdd) and ground (Gnd or Vss), wherein node (B) is formed between pull-up transistor (T4) and pull-down transistor (T5). Transistors (T2, T3) may be cross-coupled with transistors (T4, T5) such that node (A) is coupled to the gates of transistors (T4, T5) and such that node (B) is coupled to the gates of transistors (T2, T3). In various instances, transistors (T2, T4) may refer to P-type field-effect transistors (PFET), and transistors (T1, T3, T5, T6) refer to N-type FET (NFET) transistors. However, various other configurations may be used to achieve similar results, behavior and/or characteristics.

In some operational conditions, the bitcell architecture 104 may adversely suffer from bitline leakage due to leakage of bitline voltage on a bitline (BL) through one or more transistors, such as, e.g., transistors (T1, T3), to ground (Vss or Gnd). For instance, in high performance Systems-on-Chip (SoC) applications, leakage power consumption may be comparable to dynamic components, and relevance of this leakage may increase as technology scales higher. In various scenarios, there may be considerable static power consumption from the bitline precharge header supply through the bitlines (BL, NBL) into the bitcell ground (Vss, Gnd). Also, long bitlines that are highly capacitive may consume significant dynamic power when the long bitlines are precharged.

The bitcell architecture 104 may be implemented with one or more core arrays of bitcells or memory cells, wherein each bitcell may be configured to store at least one data-bit value (e.g., data value related to a logical '0' or '1'). The one or more core arrays may include any number of bitcells arranged in various configurations, such as, e.g., two-dimensional (2D) memory arrays having any number of columns and any number of rows of multiple bitcells, which may be arranged in a 2D grid pattern for read and write memory access operations. However, even though SRAM bitcell structure is shown and described in FIG. 1, various other types of bitcell structures may be used to achieve similar results of the various bitline precharging schemes and techniques described herein.

Figure 2:
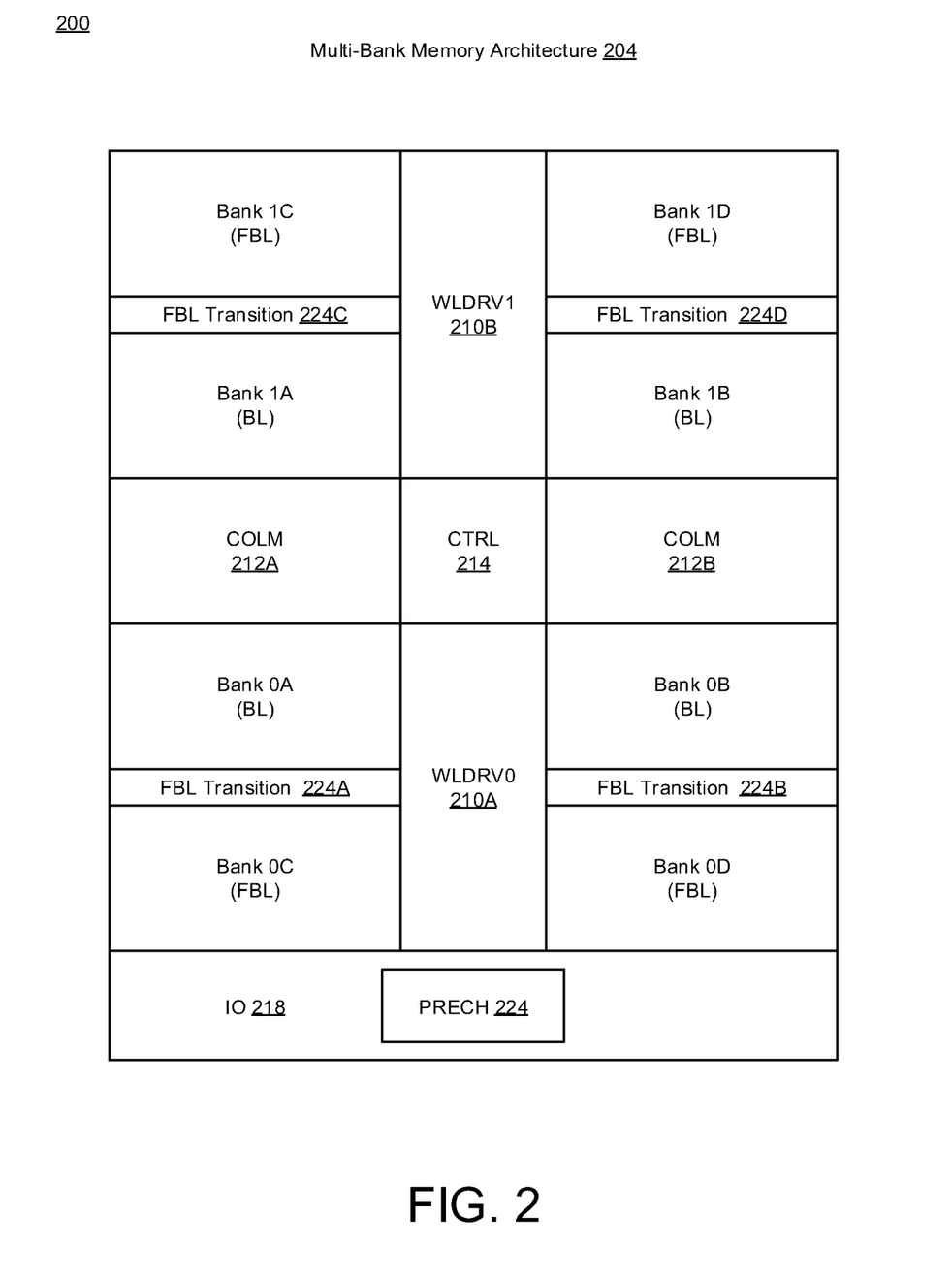
FIG. 2 illustrates a diagram of multi-bank memory architecture in accordance with various implementations described herein.

FIG. 2 illustrates a schematic diagram 200 of multi-bank memory architecture 204 in accordance with various implementations described herein.

In some implementations, the multi-bank memory architecture 204 in FIG. 2 may be implemented as a system or a device having integrated circuit (IC) components that are arranged and coupled together as an assemblage or some combination of parts that provide for physical circuit designs and various related structures. In some instances, a method of designing, providing and building the multi-bank memory architecture 204 as an integrated system or device may involve use of various circuit components described herein so as to thereby implement bitline precharge schemes and techniques associated therewith. Also, the multi-bank memory architecture 204 may be integrated with various computing circuitry and related components on a single chip, and the multi-bank memory architecture 204 may be implemented in embedded systems for automotive, electronic, mobile, server and IoT applications, including remote sensor nodes.

As shown in FIG. 2, the multi-bank memory architecture 204 includes multiple memory banks (Bank0, Bank1) with each bank having multiple segments, wherein Bank0 includes Bank0A, Bank0B, Bank 0C, Bank0D, and wherein Bank1 has Bank 1A, Bank1B, Bank 1C, Bank1D. In some implementations, bank segments (Bank0A, Bank0B, Bank1A, Bank1B) may use bitlines (BL), and bank segments (Bank0C, Bank0D, Bank1C, Bank1D) may use flexible bitlines (FBL) with FBL transition circuitry coupled between the BL banks and the FBL banks. For instance, FBL transition circuitry 224A may be coupled between BL Bank0A and FBL Bank0C, and FBL transition circuitry 224B may be coupled between BL Bank0B and FBL Bank0D. Also, in some instances, FBL transition circuitry 224C may be coupled between BL Bank1A and FBL Bank1C, and FBL transition circuitry 224D may be coupled between BL Bank1B and FBL Bank1D.

In some implementations, the multi-bank memory architecture 204 may include various other support circuitry, such as, e.g., wordline driver circuitry 210A, 210B, column multiplexer circuitry 212A, 212B, control circuitry 214 and input-output (IO) circuitry 218, which are coupled to memory banks (Bank0, Bank1) for memory access operations via columns and rows. For instance, in a first column, a first column multiplexer (COLM) 212A may be coupled to memory segments (Bank0A, Bank0C) and FBL transition 224A and to memory segments (Bank1A, Bank1C) and FBL transition 224C. In a second column, a second column multiplexer (COLM) 212B may be coupled to memory segments (Bank0B, Bank0D) and FBL transition 224B and to memory segments (Bank1B, Bank1D) and FBL transition 224D. In a first row, a first wordline driver (WLDRV) 210B may be coupled to memory segments (Bank0A, Bank0B, Bank0C, Bank0D) and FBL transitions 224A, 224B. In a second row, a second wordline driver (WLDRV) 210B may be coupled to memory segments (Bank1A, Bank1B, Bank1C, Bank1D) and FBL transitions 224C, 224D. Also, in some instances, the control circuitry (CTRL) 214 may be coupled to each bank (Bank0, Bank1) and to their corresponding column multiplexers (COLM) 212A, 212B and wordline drivers (WLDRV) 210A, 210B. Also, the input-output circuitry (IO) 218 may be coupled to each bank (Bank0, Bank1) and to their corresponding column multiplexers (COLM) 212A, 212B and wordline drivers (WLDRV) 210A, 210B.

In some implementations, the multi-bank memory architecture 304A may have multiple banks (bank0, bank1), wherein each bank includes memory circuitry with bitlines (BL/NBL, FBL/NFBL) coupled to an array of bitcells. Also, the input-output circuitry (IO) 218 may include precharge circuitry (PRECH) 224 that precharges the bitlines (BL/NBL, FBL/NFBL) during different modes of operation, e.g., including, e.g., the standby mode of operation and the active mode of operation. The precharge circuitry (PRECH) 224 may have a low power mode of operation that prevents precharge of the bitlines during standby mode of operation. The precharge circuitry (PRECH) 224 may only precharge the bitlines (BL/NBL, FBL/NFBL) during active mode of operation. The precharge circuitry may have precharge transistors that are deactivated by a bitline precharge signal so as to prevent precharge of the bitlines (BL/NBL, FBL/NFBL) in the low power mode of operation during the standby mode of operation. Also, the precharge transistors may be coupled between supply voltage and the bitlines so as to prevent transfer of the supply voltage to the bitcells in the low power mode of operation during the standby mode of operation. The precharge transistors may be activated by a bitline precharge signal so as to only precharge bitlines during the active mode of operation. The precharge transistors may be coupled between supply voltage and the bitlines so as to allow a transfer of the supply voltage to the bitcells during the active mode of operation.

In some implementations, the control circuitry may include control logic coupled to the precharge circuitry (PRECH) 224, wherein the control logic is configured to provide a bitline precharge signal to the precharge circuitry (PRECH) 224 to activate/deactivate the precharge circuitry (PRECH) 224 during the modes of operation including the standby mode of operation and the active mode of operation. The bitline precharge signal has an adjustable pulse width that is selectively adjusted so as to selectively tune precharge of the bitlines (BL/NBL, FBL/NFBL) with an extra margin adjustment (EMA) during the active mode of operation. Also, the bitlines (BL/NBL, FBL/NFBL) may have flexible bitlines (FBL, NFBL) and non-flexible bitlines (BL, NBL), and the precharge circuitry (PRECH) 224 only precharges the flexible bitlines (FBL, NFBL) or the non-flexible bitlines (BL, NBL) during the active mode of operation. Also, in some applications, the memory circuitry may have the multiple banks of bitcells with each bank (Bank0, Bank1) having the bitlines (BL/NBL, FBL/NFBL) coupled to an array of bitcells, and only an accessed bank is precharged with the precharge circuitry (PRECH) 224 during the active mode of operation.

Figure 3A:
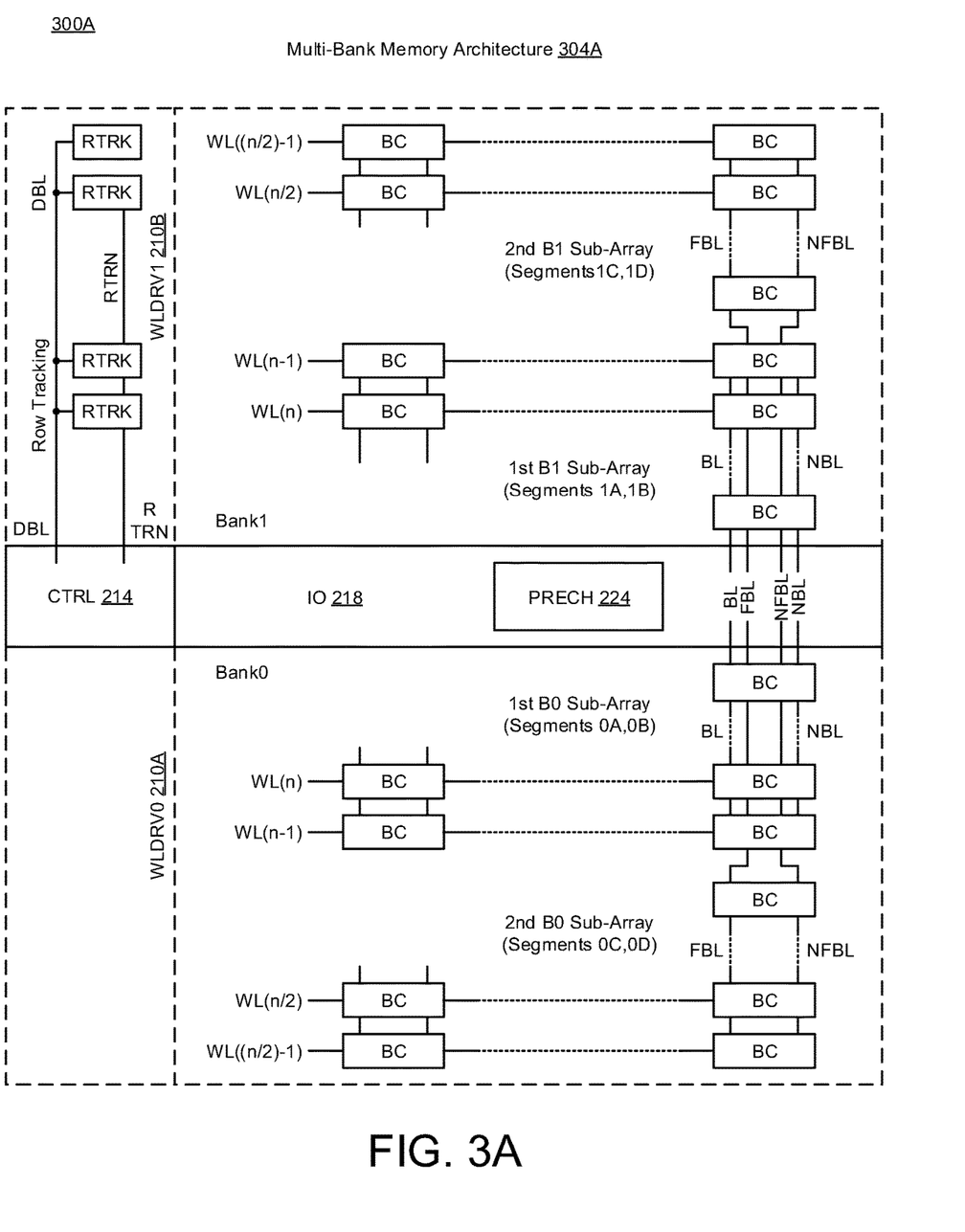
FIGS. 3A-3B illustrate various diagrams of multi-bank memory architecture in accordance with various implementations described herein.
Figure 3B:
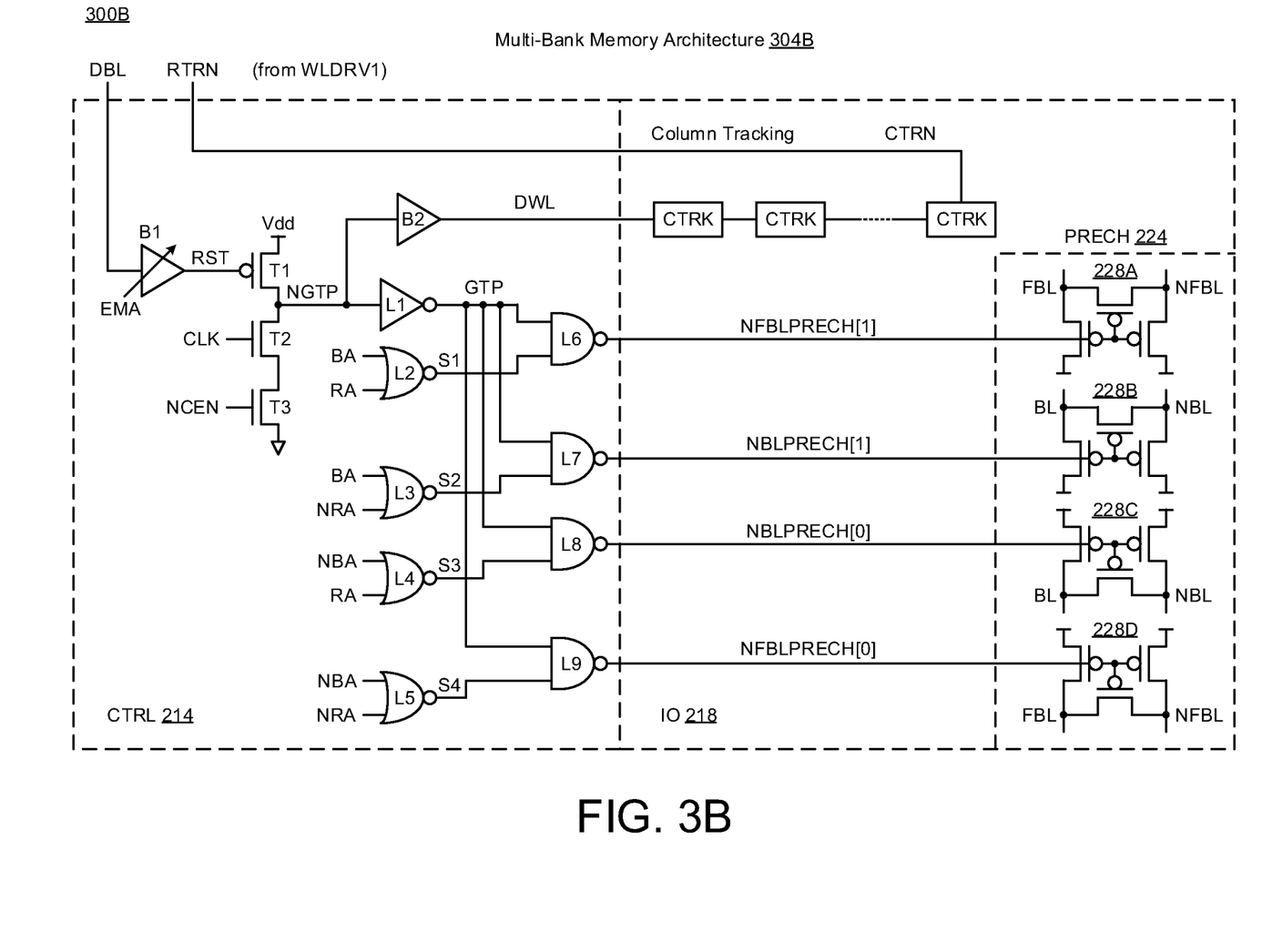

FIGS. 3A-3B illustrate various diagrams of multi-bank memory architecture in accordance with various implementations described herein. In particular, FIG. 3A refers to a diagram 300A of multi-bank memory architecture 304A, and also, FIG. 3B refers to another diagram 300B of multi-bank memory architecture 304B. In various applications, the multi-bank memory architectures 304A, 304B may include low power bitline precharge circuitry for use in various multi-bank memory circuitry and/or devices.

In some implementations, the multi-bank memory architecture 304A, 304B may be implemented as a system or device having integrated circuit (IC) components that are arranged and coupled together as an assemblage or combination of parts that provide for physical circuit designs and various related structures. In various instances, a method of designing, providing and building the multi-bank memory architecture 304A, 304B as an integrated system or device may involve use of the various circuit components described herein so as to thereby implement bitline precharge schemes and techniques associated therewith. Also, the multi-bank memory architecture 304A, 304B may be integrated with various computing circuitry and related components on a single chip, and the multi-bank memory architecture 304A, 304B may be implemented in various embedded systems for automotive, electronic, mobile, server and IoT applications.

As shown in FIG. 3A, the multi-bank memory architecture 304A may refer to a device having memory circuitry with multiple banks of bitcells (Bank0, Bank1), wherein each bank includes bitlines (BL/NBL, FBL/NFBL) coupled to an array of bitcells (BC) by way of a number (n) of wordlines WL(n), WL(n−1), . . . , WL(n/2), WL((n/2)-1). For instance, Bank0 may have a first B0 sub-array with segments 0A, 0B coupled to an array of bitcells (BC) via bitlines (BL/NBL), and Bank0 may have a second B0 sub-array with segments 0C, 0D coupled to an array of bitcells (BC) via flexible bitlines (FBL/NFBL). Also, Bank1 may have a first B1 sub-array with segments 1A, 1B coupled to an array of bitcells (BC) via bitlines (BL/NBL), and Bank1 may have a second B1 sub-array with segments 1C, 1D coupled to an array of bitcells (BC) via flexible bitlines (FBL/NFBL). Also, the first wordline driver (WLDRV0) 210A may be coupled to the first bank (Bank0) of bitcells (BC) via a first set of wordlines WL(n), WL(n−1), . . . , WL(n/2), WL((n/2)−1), and the second wordline driver (WLDRV1) 210B may be coupled to the second bank (Bank1) of bitcells (BC) via a second set of wordlines WL(n), WL(n−1), . . . , WL(n/2), WL((n/2)−1).

In some implementations, the control circuitry (CTRL) 214 may be coupled to the first wordline driver (WLDRV0) 210A and the second wordline driver (WLDRV1) 210B, and also, the input-output circuitry (IO) 218 may be coupled to the first bank (Bank0) and the second bank (Bank1). As further described in FIG. 3B, the control circuitry (CTRL) 214 may include precharge circuitry (PRECH) 224 that is coupled to the bitlines (BL/NBL) and flexible bitlines (FBL, NFBL) for precharging thereof using various bitline precharging schemes and techniques described herein. Also, in some applications, the wordline driver (WLDRV1) 210B may include row tracking circuitry (RTRK) with dummy bitline (DBL) and dummy bitline turn (RTRN) that are coupled to the control circuitry (CTRL) 214, which is further described herein in reference to FIG. 3B.

In some applications, the precharge circuitry (PRECH) 224 may be configured to separately precharge the bitlines (BL/NBL, FBL/NFBL) of each memory bank (Bank0, Bank1) during different modes of operation, including, e.g., an active mode of operation and a standby mode of operation. In some instances, only an accessed bank of the banks (Bank0, Bank1) is precharged with the precharge circuitry (PRECH) 224 during the active mode of operation. In other instances, the precharge circuitry (PRECH) 224 may have a low power mode of operation that separately prevents precharge of the bitlines (BL/NBL, FBL/NFBL) of each bank (Bank0, Bank1) during the standby mode of operation.

As shown in FIG. 3B, the multi-bank memory architecture 304B refers to and includes the control circuitry (CTRL) 214 and input-output circuitry (IO) 218 from the multi-bank memory architecture 304A shown in FIG. 3A. In some implementations, the CTRL 214 may include various logic gates (B0, B1 and L1, L2, . . . , L9) and transistors (T1, T2, T3) that are arranged and configured to receive the row tracking signals (DBL, TRN) along with control signals (BA/NBA, RA/NRA) and generate precharge signals (NBLPRECH[0], NFBLPRECH[0], NBLPRECH[1], NFBLPRECH[1]) for precharging the bitlines (BL/NBL, FBL/NFBL) with the precharge circuitry (PRECH) 224.

In some implementations, the DBL signal is provided to an input of buffer (B1), wherein buffer (B1) generates a reset signal (RST) based on an extra margin adjust signal (EMA) that is selectively tunable so as to selectively adjust the pulse width of the bitline precharge signals. Also, the RST signal is provided to a gate of transistor (T1) by way of buffer (B1), a clock signal (CLK) is provided to a gate of transistor (T2), and a chip-enable signal (negated-CEN) is provided to a gate of transistor (T3). Transistors (T1, T2, T3) are coupled in series between a supply voltage (Vdd) and ground (Vss or Gnd), and an output signal (NGTF) is provided via a node that is disposed between transistors (T1, T2). Also, the NGTF signal may be provided to column tracking circuitry (CTRK) by way of a dummy wordline (DWL) and buffer (B2), and also, the column tracking circuitry (CTRK) includes the DWL and a dummy wordline turn (RTRN), which are coupled to the second wordline driver (WLDRV1) 210B, which is described above in reference to FIG. 3A.

In some implementations, inverter logic gate (L1) receives NGTF signal as input and provides a global timing pulse signal (GTP) to logic gates (L6, L7, L8, L9). Also, logic gate (L2) receives control signals (BA, RA) and provides output signal (S1) to logic gate (L6), logic gate (L3) receives control signals (BA, NRA) and provides output signal (S2) to logic gate (L7), logic gate (L4) receives control signals (NBA, RA) and provides output signal (S3) to logic gate (L8), and logic gate (L5) receives control signals (NBA, NRA) and provides output signal (S4) to logic gate (L9). In some instances, logic gates (L2, L3, L4, L5) may be NOR gates, and logic gates (L6, L7, L8, L9) may be NAND gates; however, various other logic gates may be used for similar results and/or behavior.

In some implementations, the precharge circuitry 224 includes precharge logic 228A, 228B, 228C, 228D. In some instances, logic gate (L6) receives input signals (GTP, S1) and provides NBLPRECH[1] signal to precharge logic 228A of PRECH 224, wherein the precharge logic 228A has multiple precharge transistors coupled to the flexible bitlines (FBL, NFBL) in second B1 sub-array of Bank1. Also, logic gate (L7) receives input signals (GTP, S2) and provides NFBLPRECH[1] signal to precharge logic 228B of PRECH 224, wherein the precharge logic 228B has multiple precharge transistors coupled to bitlines (BL, NBL) in first B1 sub-array of Bank1. Also, logic gate (L8) receives input signals (GTP, S3) and provides NBLPRECH[0] signal to precharge logic 228C of PRECH 224, wherein precharge logic 228C has multiple precharge transistors coupled to the bitlines (BL, NBL) in first B0 sub-array of Bank0. Also, logic gate (L9) receives input signals (GTP, S4) and provides NFBLPRECH[8] signal to the precharge logic 228D of PRECH 224, wherein the precharge logic 228D has multiple precharge transistors coupled to flexible bitlines (FBL, NFBL) in the second B0 sub-array of Bank0. Moreover, the bitlines (BL/NBL, FBL/NFBL) are coupled to the supply voltage (Vdd) by way of the precharge transistors.

Therefore, the control circuitry (CTRL) 214, the input-output circuitry (IO) 218, and the precharge circuitry (PRECH) 224 are configured to provide for precharge signal generation, wherein in some implementations, only one of multiple nblprech signals (e.g., 4) is activated in reference to a particular read/write operation.

In various implementations, the precharge circuitry (PRECH) 224 is configured to separately precharge bitlines (BL/NBL, FBL/NFBL) of each bank (Bank0, Bank1) during different modes of operation, including, e.g., the active mode of operation and the standby mode of operation. In some instances, only an accessed bank of the banks is precharged with precharge circuitry during active mode of operation, and also, the precharge circuitry may use a low power mode of operation that separately prevents precharge of the bitlines of each bank during standby mode of operation. Also, the precharge circuitry (PRECH) 224 may only precharge bitlines of each bank during the active mode of operation. Also, the precharge circuitry (PRECH) 224 may have precharge transistors for each bank that are deactivated by a bitline precharge signal so as to selectively prevent precharge of the bitlines of each bank (Bank0, Bank1) in low power mode of operation during the standby mode of operation. Also, precharge transistors for each bank are coupled between supply voltage and the bitlines of each bank so as to selectively prevent transfer of the supply voltage to the bitcells of each bank in the low power mode of operation during the standby mode of operation. Also, the precharge transistors for each bank may be activated by a bitline precharge signal so as to selectively precharge the bitlines of each bank during the active mode of operation. Also, the precharge transistors for each bank may be coupled between supply voltage and the bitlines of each bank so as to allow transfer of the supply voltage to the bitcells of each bank during the active mode of operation.

In some implementations, the control circuitry (CTRL) 214 may include control logic coupled to the precharge circuitry (PRECH) 224, wherein the control logic provides the bitline precharge signal to the precharge circuitry (PRECH) 224 to activate/deactivate the precharge circuitry (PRECH) 224 during the modes of operation including the standby mode of operation and the active mode of operation. Further, the bitline precharge signal may have an adjustable pulse width that is selectively adjusted so as to selectively tune precharge of the bitlines of each bank with an extra margin adjustment during the active mode of operation. Also, in some instances, the bitlines of each bank may include flexible bitlines (FBL, NFBL) and non-flexible bitlines (BL, NBL), and also, the precharge circuitry (PRECH) 224 only precharges the flexible bitlines (FBL, NFBL) or the non-flexible bitlines (BL, NBL) of each bank during the active mode of operation.

Figure 4:
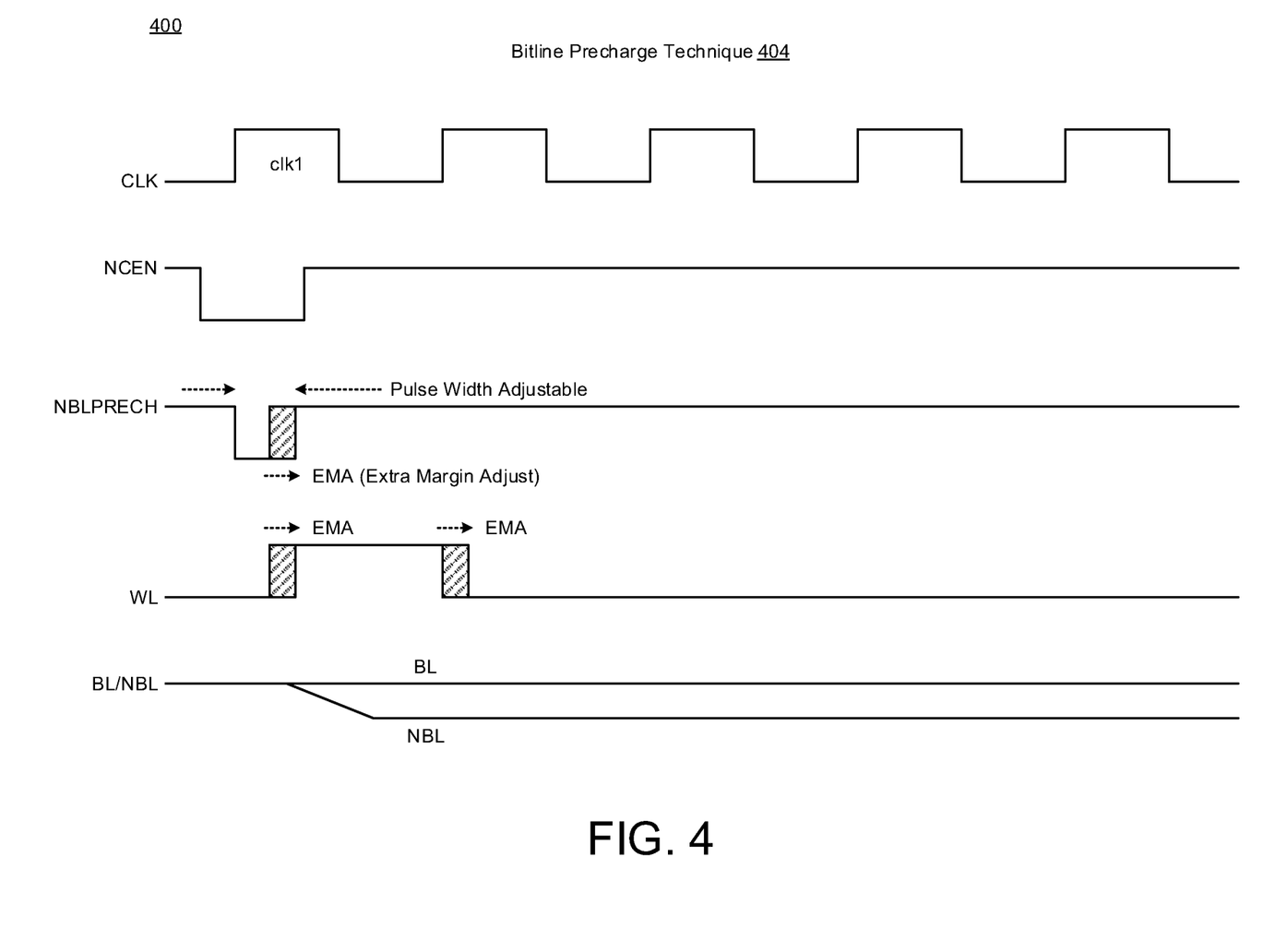
FIG. 4 illustrates a waveform diagram of utilizing a bitline precharge technique in accordance with various implementations described herein.

FIG. 4 illustrates a waveform diagram 400 for utilization of a bitline precharge technique 404 in accordance with various implementations described herein.

As shown in FIG. 4, the waveform diagram 400 shows the clock pulse signal (CLK) and the negated chip-enable signal (NCEN) that is activated, in some instances, before the first clock pulse (clk1). With the NCEN enabled, the NBL-PRECH signal is then activated when the CLK signal is activated. In some implementations, pulse width of the NBLPRECH signal is selectively adjustable based on the EMA signal. Also, the wordline signal (WL) may be selectively adjustable based on EMA adjustment of the NBL-PRECH signal. Thus, the bitlines (BL, NBL) may then be precharged.

Thus, in reference to FIGS. 3A-3B and 4, the various schemes and techniques described herein may provide for a memory macro having multiple banks (Bank0, Bank1), wherein each bank is divided into sub-arrays that are coupled to non-flexible bitlines (BL, NBL) or flexible bitlines (FBL, NFBL). In some applications, the external clock (CLK) and chip-enable signal (NCEN or negated-CEN) are used to start the internal memory clock pulse (GTP), which is referred to as the global tracking pulse. Also, the memory self-time path includes the row/column tracking circuitry so as to mimic the actual memory access delay to thereby adjust the width of the NBLPRECH signal. Also, the EMA signal may be used to externally adjust the number of buffers in the reset path (RST path), which may be used to control the NBLPRECH pulse width. In various instances, different precharge activation signals may be generated based on the GTP signal depending on row address (RA) and bank address (BA). Further, for any given read-write cycle, only one of multiple precharge activation signals (e.g., 4) may be asserted.

Figure 5:
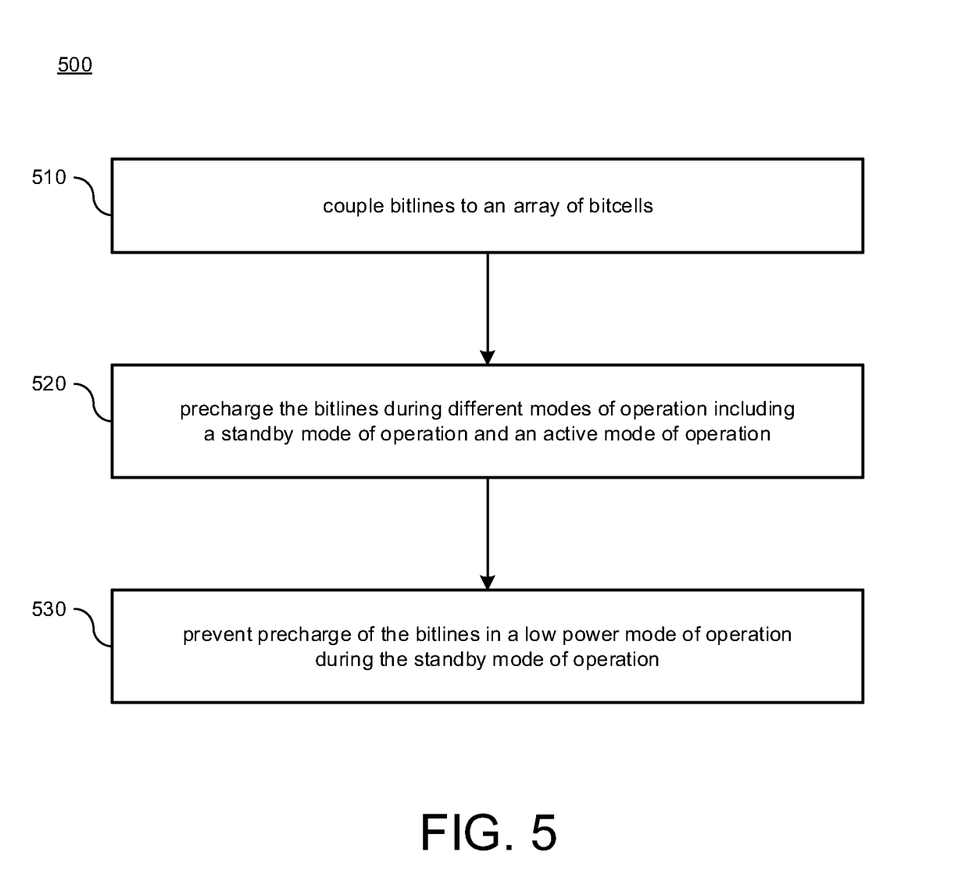
FIG. 5 illustrates a diagram of a method for precharging bitlines in accordance with various implementations described herein.

FIG. 5 illustrates a process diagram of a method 500 for precharging bitlines in accordance with various implementations described herein. In some implementations, method 500 provides for low power bitline precharging schemes and techniques.

It should be understood that even though the method 500 indicates a particular order of operation execution, in some cases, various particular portions of the operations may be executed in a different order, and on different systems. In other cases, additional operations and/or steps may be added to and/or omitted from method 500. Also, method 500 may be implemented in hardware and/or software. If implemented in hardware, the method 500 may be implemented with various components and/or circuitry, as described herein in reference to FIGS. 1-4. Also, if implemented in software, method 500 may be implemented as a program and/or a software instruction process configured for providing bitcell architecture schemes and techniques, as described herein. Further, if implemented in software, various instructions associated with implementing method 500 may be stored in memory and/or a database. For instance, various types of computing devices having one or more processors and memory may be configured to perform method 500.

In various implementations, method 500 may refer to a method of designing, providing, building, fabricating and/or manufacturing memory structures as an integrated device that may involve use of various components and materials described herein. Also, the memory structures may be integrated with computing circuitry and components on a single chip, and further, the memory structures may be implemented in various embedded systems for various electronic, mobile, server and/or Internet-of-things (IoT) applications, including remote sensor nodes in various remote based applications.

At block 510, method 500 may couple bitlines to an array of bitcells. At block 520, method 500 may precharge the bitlines during different modes of operation including a standby mode of operation and an active mode of operation. At block 530, method 500 may prevent precharge of the bitlines during a low power mode of operation during the standby mode of operation. In some instances, method 500 may use precharge circuitry having precharge transistors that are deactivated by a bitline precharge signal so as to prevent precharge of the bitlines in the low power mode of operation during the standby mode of operation. Also, method 500 may use precharge transistors coupled between a supply voltage and the bitlines so as to prevent transfer of the supply voltage to the bitcells in the low power mode of operation during the standby mode of operation.

In various applications, method 500 may only precharge the bitlines during the active mode of operation. Also, method 500 may use precharge transistors activated by a bitline precharge signal so as to only precharge the bitlines during the active mode of operation. Also, method 500 may use precharge transistors that are coupled between the supply voltage and the bitlines so as to allow transfer of the supply voltage to the bitcells during the active mode of operation.

In various applications, method 500 may use control circuitry with control logic coupled to the precharge circuitry, wherein the control logic provides the bitline precharge signal to the precharge circuitry for activating/deactivating the precharge circuitry during the different modes of operation including the standby mode of operation and the active mode of operation. The bitline precharge signal may have an adjustable pulse width that is selectively adjusted so as to thereby selectively tune precharge of the bitlines with an extra margin adjustment during the active mode of operation.

In various applications, the bitlines may include flexible bitlines and non-flexible bitlines, and the precharge circuitry only precharges the flexible bitlines or the non-flexible bitlines during the active mode of operation. Also, the memory circuitry may have multiple banks of bitcells with each bank having bitlines coupled to an array of bitcells, and in this instance, method 500 may only precharge an accessed bank with the precharge circuitry during the active mode of operation.

Some advantages of the bitline precharge schemes and techniques described herein reduce power in the standby mode by not precharging bitlines. Another advantage may refer to precharging the bitlines in only the accessed bank so as to reduce power in un-accessed banks. Another advantage may refer to only precharging FBLs or BLs in the accessed bank so as to reduce bitline precharge power in the accessed bank, e.g., by a significant amount, such as, e.g., about half. Further, externally tunable bitline precharge pulse may also offer protection against silicon variations.

It should be intended that the subject matter of the claims not be limited to the implementations and illustrations provided herein, but include modified forms of those implementations including portions of implementations and combinations of elements of different implementations in accordance with the claims. It should be appreciated that in the development of any such implementation, as in any engineering or design project, numerous implementation-specific decisions should be made to achieve developers' specific goals, such as compliance with system-related and business related constraints, which may vary from one implementation to another. Moreover, it should be appreciated that such a development effort may be complex and time consuming, but would nevertheless be a routine undertaking of design, fabrication, and manufacture for those of ordinary skill having benefit of this disclosure.

Described herein are various implementations of a device with memory circuitry having bitlines coupled to an array of bitcells. The device may include precharge circuitry that precharges the bitlines during modes of operation including a standby mode of operation and an active mode of operation. In some instances, the precharge circuitry may include a low power mode of operation that prevents precharge of the bitlines during the standby mode of operation.

Described herein are various implementations of a device with memory circuitry having banks of bitcells with each bank having bitlines coupled to an array of bitcells. The device may have precharge circuitry that separately precharges the bitlines of each bank during modes of operation including an active mode of operation and a standby mode of operation. In some instances, only an accessed bank of the banks is precharged with the precharge circuitry during the active mode of operation. In some instances, the precharge circuitry may have a low power mode of operation that separately prevents precharge of the bitlines of each bank during the standby mode of operation.

Described herein are various implementations of a method. The method may include coupling bitlines to an array of bitcells. The method may include precharging the bitlines during different modes of operation including a standby mode of operation and an active mode of operation. In some instances, the precharge circuitry may operate in a low power mode of operation that prevents precharge of the bitlines during the standby mode of operation.

Reference has been made in detail to various implementations, examples of which are illustrated in the accompanying drawings and figures. In the following detailed description, numerous specific details are set forth to provide a thorough understanding of the disclosure provided herein. However, the disclosure provided herein may be practiced without these specific details. In some other instances, well-known methods, procedures, components, circuits and networks have not been described in detail so as not to unnecessarily obscure details of the embodiments.

It should also be understood that, although the terms first, second, etc. may be used herein to describe various elements, these elements should not be limited by these terms. These terms are only used to distinguish one element from another. For example, a first element could be termed a second element, and, similarly, a second element could be termed a first element. The first element and the second element are both elements, respectively, but they are not to be considered the same element.

The terminology used in the description of the disclosure provided herein is for the purpose of describing particular implementations and is not intended to limit the disclosure provided herein. As used in the description of the disclosure provided herein and appended claims, the singular forms "a," "an," and "the" are intended to include the plural forms as well, unless the context clearly indicates otherwise. The term "and/or" as used herein refers to and encompasses any and all possible combinations of one or more of the associated listed items. The terms "includes," "including," "comprises," and/or "comprising," when used in this specification, specify a presence of stated features, integers, steps, operations, elements, and/or components, but do not preclude the presence or addition of one or more other features, integers, steps, operations, elements, components and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context. The terms "up" and "down"; "upper" and "lower"; "upwardly" and "downwardly"; "below" and "above"; and other similar terms indicating relative positions above or below a given point or element may be used in connection with some implementations of various technologies described herein.

While the foregoing is directed to implementations of various techniques described herein, other and further implementations may be devised in accordance with the disclosure herein, which may be determined by the claims that follow.

Although the subject matter has been described in language specific to structural features and/or methodological acts, it is to be understood that the subject matter defined in the appended claims is not necessarily limited to the specific features or acts described above. Rather, specific features and acts described above are disclosed as example forms of implementing the claims.

What is claimed is:

1. A device comprising:
   memory circuitry having bitlines coupled to an array of bitcells;
   precharge circuitry configured to precharge the bitlines during modes of operation including a standby mode of operation and an active mode of operation wherein the precharge circuitry includes:
   a low power mode of operation that prevents the precharge of the bitlines during the standby mode of operation; and
   precharge transistors that are coupled between a voltage supply and the bitlines, wherein each of the precharge transistors is configured to be activated or deactivated by a bitline precharge signal during the modes of operation; and
   control circuitry configured to provide the bitline precharge signal to the precharge circuitry based on an extra margin adjust (EMA) signal.

2. The device of claim 1, wherein the precharge circuitry is further configured to precharge the bitlines only during the active mode of operation.

3. The device of claim 1, wherein the precharge transistors are configured to be deactivated by the bitline precharge signal so as to prevent the precharge of the bitlines in the low power mode of operation during the standby mode of operation.

4. The device of claim 1, wherein the precharge transistors are configured to prevent a transfer of voltage from the voltage supply to the bitcells in the low power mode of operation during the standby mode of operation.

5. The device of claim 1, wherein the precharge transistors are configured to be activated by the bitline precharge signal so as to precharge the bitlines only during the active mode of operation.

6. The device of claim 1, wherein the precharge transistors are configured to allow a transfer of voltage from the voltage supply to the bitcells during the active mode of operation.

7. The device of claim 1, wherein the control circuitry includes control logic coupled to the precharge circuitry, wherein the control logic is configured to:
   receive the EMA signal, wherein the EMA signal is configured to be selectively tunable;
   generate the bitline precharge signal based on the selectively tunable EMA signal; and
   provide the bitline precharge signal to the precharge circuitry for activating or deactivating the precharge circuitry during the modes of operation including the standby mode of operation and the active mode of operation.

8. The device of claim 7, wherein the bitline precharge signal is configured to have an adjustable pulse width that is selectively adjusted based on the selectively tunable EMA signal so as to selectively tune the precharge of the bitlines with an extra margin adjustment during the active mode of operation.

9. The device of claim 1, wherein the bitlines include flexible bitlines and non-flexible bitlines, and wherein the precharge circuitry is configured to precharge the flexible bitlines or the non-flexible bitlines only during the active mode of operation.

10. The device of claim 1, wherein the memory circuitry has multiple banks of bitcells with each bank having respective bitlines coupled to a respective array of bitcells, and wherein only an accessed bank is precharged with the precharge circuitry during the active mode of operation.

11. A device comprising:
    memory circuitry having banks of bitcells with each bank having bitlines coupled to an array of bitcells, wherein the bitlines of each bank include flexible bitlines and non-flexible bitlines;
    precharge circuitry configured to separately precharge the bitlines of each bank during modes of operation including an active mode of operation and a standby mode of operation, wherein only an accessed bank of the banks is precharged with the precharge circuitry during the active mode of operation, and wherein the precharge circuitry includes:
    a low power mode of operation that separately prevents precharge of the bitlines of each bank during the standby mode of operation; and
    precharge transistors for each bank that are coupled between a voltage supply and the bitlines of each bank, wherein each of the precharge transistors for each bank is configured to be activated or deactivated by a bitline precharge signal during the modes of operation; and
    control circuitry configured to provide the bitline precharge signal to the precharge circuitry based on an extra margin adjust (EMA) signal, wherein the EMA signal is configured to be selectively tunable.

12. The device of claim 11, wherein the precharge circuitry is further configured to precharge the bitlines of each bank only during the active mode of operation.

13. The device of claim 11, wherein the precharge transistors for each bank are configured to be deactivated by the bitline precharge signal so as to selectively prevent the precharge of the bitlines of each bank in the low power mode of operation during the standby mode of operation.

14. The device of claim 11, wherein the precharge transistors for each bank are configured to selectively prevent a transfer of voltage from the voltage supply to the bitcells of each bank in the low power mode of operation during the standby mode of operation.

15. The device of claim 11, wherein the precharge transistors for each bank are configured to be activated by the bitline precharge signal so as to selectively precharge the bitlines of each bank during the active mode of operation.

16. The device of claim 11, wherein the precharge transistors for each bank are configured to allow a transfer of voltage from the voltage supply to the bitcells of each bank during the active mode of operation.

17. The device of claim 11, wherein the control circuitry includes control logic coupled to the precharge circuitry, wherein the control logic is configured to:
   receive the selectively tunable EMA signal;
   generate the bitline precharge signal based on the selectively tunable EMA signal; and
   provide the bitline precharge signal to the precharge circuitry for activating or deactivating the precharge circuitry during the modes of operation including the standby mode of operation and the active mode of operation.

18. The device of claim 17, wherein the bitline precharge signal is configured to have an adjustable pulse width that is selectively adjusted based on the selectively tunable EMA signal so as to selectively tune the precharge of the bitlines of each bank with an extra margin adjustment during the active mode of operation.

19. The device of claim 11, wherein the precharge circuitry is configured to precharge the flexible bitlines or the non-flexible bitlines of each bank only during the active mode of operation.

20. A method comprising:
   coupling bitlines to an array of bitcells; and
   precharging the bitlines using precharge circuitry during different modes of operation including a standby mode of operation and an active mode of operation, wherein the precharge circuitry includes:
      a low power mode of operation that prevents precharge of the bitlines during the standby mode of operation; and
      precharge transistors that are coupled between a voltage supply and the bitlines, wherein each of the precharge transistors is configured to be activated or deactivated by a bitline precharge signal during the modes of operation; and
   using control circuitry to provide the bitline precharge signal to the precharge circuitry based on an extra margin adjust (EMA) signal, wherein the EMA signal is configured to be selectively tunable.

* * * * *